(12) United States Patent
Lammel et al.

(10) Patent No.: US 7,404,332 B2
(45) Date of Patent: Jul. 29, 2008

(54) MICROMECHANICAL COMPONENT AND METHOD

(75) Inventors: Gerhard Lammel, Tuebingen (DE); Simon Armbruster, Reutlingen (DE); Frank Schaefer, Tuebingen (DE); Hubert Benzel, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/529,420

(22) PCT Filed: Mar. 6, 2003

(86) PCT No.: PCT/DE03/00703

§ 371 (c)(1), (2), (4) Date: Nov. 29, 2005

(87) PCT Pub. No.: WO2004/028957

PCT Pub. Date: Apr. 8, 2004

(65) Prior Publication Data

US 2006/0137460 A1 Jun. 29, 2006

(30) Foreign Application Priority Data

Sep. 26, 2002 (DE) ................................ 102 44 786

(51) Int. Cl.
*G01L 7/00* (2006.01)

(52) U.S. Cl. ....................................................... 73/756

(58) Field of Classification Search ................. 73/756, 73/700, 754
See application file for complete search history.

(56) References Cited

U.S. PATENT DOCUMENTS

| 5,542,558 | A | * | 8/1996 | Benz et al. ...................... 216/2 |
| 5,594,171 | A | * | 1/1997 | Ishida et al. .............. 73/514.32 |
| 5,882,496 | A | * | 3/1999 | Northrup et al. ............. 204/601 |
| 6,139,758 | A | | 10/2000 | Tu |
| 6,323,550 | B1 | * | 11/2001 | Martin et al. ................ 257/704 |
| 6,828,253 | B2 | * | 12/2004 | Gole et al. ................... 438/753 |
| 2006/0037932 | A1 | * | 2/2006 | Lammel et al. ................. 216/2 |
| 2006/0063293 | A1 | * | 3/2006 | Benzel et al. .................. 438/53 |

FOREIGN PATENT DOCUMENTS

WO 96 39632 12/1996
WO 02 02458 1/2002

OTHER PUBLICATIONS

Henmi et al., *Vacuum Packaging for Microsensors by Glass-Silicon Anodic Bonding*, Sensors and Actuators, Lausanne, Switzerland, May 1, 1994, vol. A43, No. 1/3, pp. 243-248.

* cited by examiner

*Primary Examiner*—Andre J Allen
(74) *Attorney, Agent, or Firm*—Kenyon & Kenyon LLP

(57) ABSTRACT

A micromechanical component and a method for producing a micromechanical component are proposed, a hollow space and a region of porous silicon being provided, the region of porous silicon being provided for lowering the pressure prevailing in the hollow space.

21 Claims, 2 Drawing Sheets

MICROMECHANICAL COMPONENT AND METHOD

FIELD OF THE INVENTION

The present invention is directed to a micromechanical component and to a method.

BACKGROUND INFORMATION

Getter materials of porous metals are generally known which are used for binding gases in closed systems. The task at hand is to enclose a low pressure in such a closed system, such as a hollow space, for example, this pressure approaching vacuum pressure. Getter materials can be used to bind the entrapped gases and, in this way, greatly reduce the pressure. The disadvantage associated with the known getter materials is that the process for producing such materials is not suited for a semiconductor manufacturing process. Another disadvantage associated with the known getter materials is that they are not suited for semiconductors.

SUMMARY OF THE INVENTION

In contrast, the advantage of the micromechanical component and of the method of the alternative independent claims is that the getter material provided is made of porous silicon. This porous silicon may easily be integrated into an existing semiconductor process. Moreover, the porous silicon is also very suited for semiconductors. It is also beneficial that the porous silicon is provided as an inexpensive getter material. Porous silicon binds oxygen (O2), for example, by forming silicon dioxide already in response to low temperatures. This eliminates the need for heating the component to high temperatures, as, for example, in a high-temperature annealing process, in order to activate the getter material in the form of porous silicon. In addition, it is advantageous that the porous silicon may be easily integrated into semiconductor processes, such as CMOS, BCD and the like, for example, and that the porous silicon may be used as getter material, for example, when encapsulating sensors, in order to minimize the enclosed pressure. It is also advantageously provided in accordance with the present invention to use porous silicon to produce a large surface area, in particular of up to over 1000 $m^2$ per $cm^3$, to achieve highly effective getter characteristics.

It is especially beneficial that a first substrate and a second substrate are provided, an intermediate layer being provided between the first and the second substrate. In this way, using especially simple means, such as wafer bonding, it is possible to imperviously join together the first substrate and the second substrate, thereby producing the hollow space. It is also advantageous that the first and the second substrate are joined to one another in such a way that they are hermetically sealed at the intermediate layer. To this end, it is advantageously possible in accordance with the present invention to retain the vacuum provided by the getter material in the form of porous silicon, in the hollow space. It is also beneficial that a first substrate and a membrane are provided, the hollow space being provided between the membrane and the first substrate, and the region of the porous silicon being provided in the first substrate. This makes it possible to manufacture an absolute-pressure sensor, for example, in a simple manner, which delivers a precise measuring result already in response to low pressures to be measured, because the pressure to be compared is very low in the interior of the hollow space.

DETAILED DESCRIPTION

Figure 1:
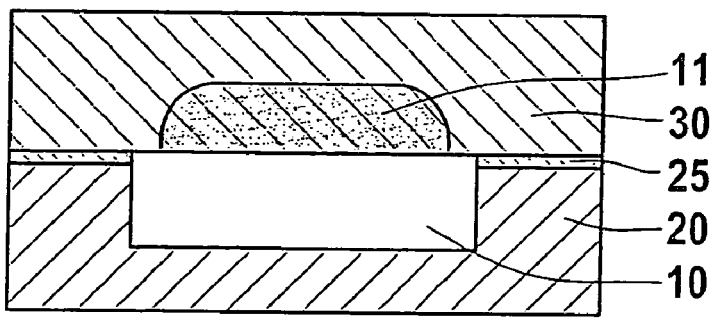
FIG. 1 is a diagrammatic sketch of the micromechanical component according to the present invention.

In the manufacturing of micromechanical components or micromechanical elements, such as acceleration, rotation-rate, or pressure sensors, a hollow space having an enclosed vacuum is often required. In all of the figures, reference numeral 10 denotes the hollow space. Such hollow spaces or volumes 10 may be produced in different ways. For example, a recess may be produced by etching. In a subsequent step, a second substrate 30 is bonded to a first substrate that has been pretreated in such a manner, various methods being used here as well, such as, in particular, seal-glass bonding, wafer direct bonding, or anodic bonding. It is also provided in accordance with the present invention to bond or solder first substrate 20 to second substrate 30. These bonding processes are mostly carried out in a vacuum. The reason for this is that it is necessary for a vacuum to prevail in hollow space 10 after it is hermetically sealed. Often disadvantageously associated with the bonding processes is, however, that they, by nature, are often themselves associated, with an evolution of gas, so that the internal pressure of hollow space 10 cannot be arbitrarily reduced. For that reason, before hollow space 10 is sealed, in accordance with the present invention, a getter material is introduced into volume 10 to be occluded or contiguously thereto, the forming gases being bound by the getter material, and the pressure prevailing in hollow space 10 being able to be reduced. In accordance with the present invention, exclusively porous silicon is provided as getter material. This porous silicon is shown in all figures as a region of porous silicon denoted by reference numeral 11. In accordance with the present invention, when porous silicon is used as getter material, it is advantageous that only low temperatures are needed to activate the getter property. Such low temperatures can be easily integrated into semiconductor processes. This means that it is possible to activate the porous silicon as getter material, even after the semiconductor components are manufactured, it being necessary to consider that, typically, finished semiconductor components have a lower temperature resistance than the pure semiconductor material used for its manufacture. The oxygen may be bound, for example, to the very large surface area of porous silicon 11. Porous silicon dioxide is then formed from the gaseous oxygen and the porous silicon.

One particularly advantageous field of application of the method according to the present invention and of the micromechanical component according to the present invention is using the porous silicon as oxygen getter, for example during anodic bonding, the anodic bonding denoting a bonding of silicon, in particular of silicon wafers, for the most part using sodium-containing glass. In this process, oxygen is formed at the bonding surface, and diffuses into the hollow spaces and, in particular, into hollow space 10, and may be bound in hollow space 10, i.e., in cavity 10 by getter materials, such as, in particular, by porous silicon 11 according to the present invention, in order to produce a lowest possible pressure in hollow space 10 or in cavity 10. The anodic bonding is carried out at an elevated temperature in accordance with the present invention of, for example 400° C., at which the porous silicon is reactive and at which the corresponding oxygen binds right in the same process. The getter action of the porous silicon or of the region of porous silicon 11 may be intensified in a subsequent optional annealing process.

In seal-glass bonding, as well, oxygen is formed, inter alia, which may be bound, thereby enabling the internal pressure in hollow space 10 or in cavity 10 to be at least partially lowered. Other gases besides oxygen, which are likewise formed during seal-glass bonding, may, however, likewise be adsorbed at the very large surface area of the porous silicon and, thus, also reduce the pressure.

The porous silicon may also be advantageously used in accordance with the present invention as getter material in a silicon fusion bonding process, high temperatures of about 1000° C. being reached during this process, the porous silicon not being destroyed, however.

FIG. 1 shows a diagrammatic sketch of the micromechanical component according to the present invention. In an enclosed volume, also designated as hollow space 10, at any desired surface area, i.e., at any desired location adjoining hollow space 10, a region of porous silicon 11 is provided, the micromechanical component according to the present invention having a first substrate 20 and a second substrate 30, first substrate 20 being joined to second substrate 30 and an intermediate layer 25 being provided between substrates 20, 30. In accordance with the present invention, first substrate 20 is provided, in particular, as a silicon substrate, and second substrate 30 is likewise provided, in particular, as a silicon substrate. In the diagrammatic sketch of FIG. 1, the region of porous silicon 11 is provided in second substrate 30. When second substrate 30 is provided as the silicon substrate, region 11 of porous silicon may be produced quite simply by etching into the silicon material of second substrate 30. When bonding first substrate 20 to second substrate 30, it is especially provided in accordance with the present invention to carry out a wafer bonding method or a wafer bonding method step, intermediate layer 25 being provided, for example, as sealing glass.

Figure 2:
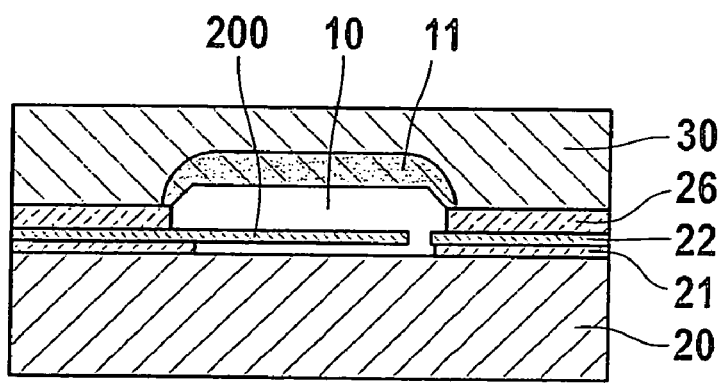
FIG. 2 is a first specific embodiment of the micromechanical component.

FIG. 2 shows a first specific embodiment of the micromechanical component according to the present invention. The component includes first substrate 20, which has a micromechanical structure 200. To produce the micromechanical structure, a sacrificial layer 21, for example in the form of a sacrificial oxide 21, is provided in first substrate 20. A functional layer 22, constituted, in particular, of an epi-polysilicon layer, is also provided in first substrate 20 in the component according to the present invention, to produce micromechanical structure 200. In this functional layer 22, micromechanical structure 200 includes resonator structures, for example. Also shown in FIG. 2 is second substrate 30, which includes region 11 of porous silicon. When first substrate 20 is joined to second substrate 30 at a bonding layer 26, hollow space 10 is formed by the structuring of substrates 20, 30. The region of porous silicon 11, which adjoins hollow space 10, is provided in second substrate 30. Micromechanical structure 200 forms, in particular, an acceleration or rotation-rate sensor. Bonding layer 26 includes, in particular, sealing glass.

Figure 3:
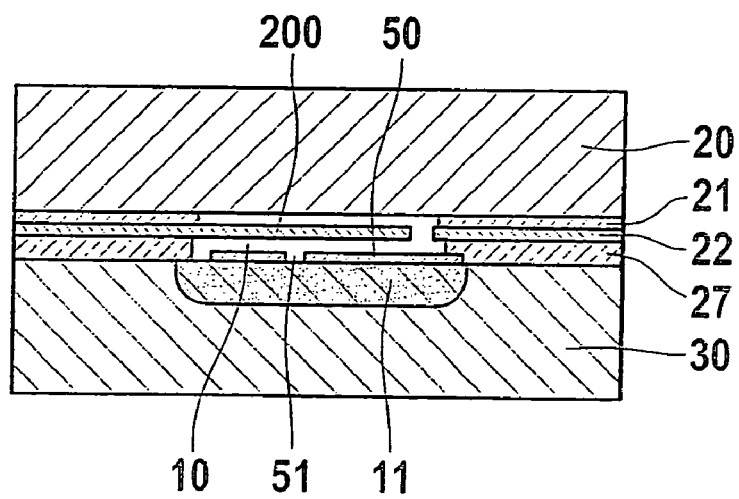
FIG. 3 is a second specific embodiment of the micromechanical component according to the present invention.

FIG. 3 shows a second specific embodiment of the micromechanical component according to the present invention. In this case, first substrate 20 is shown in the upper region of FIG. 3. First substrate 20 is also referred to as sensor substrate. In first substrate or on first substrate 20, micromechanical structure 200 is produced, to this end, a sacrificial layer 21 and a functional layer 22, in particular of epi-polysilicon, again being provided. In the second specific embodiment, a composite wafer is provided, in particular, as a second substrate 30, the composite wafer being composed of actual second substrate 30 and of another bonding layer 27, other bonding layer 27 being joined, in particular, as a Pyrex glass layer, to actual second substrate 30. In this respect, together with second substrate 30, additional bonding layer 27 forms the composite wafer. In the composite wafer, a region of porous silicon 11 is provided, as is a so-called shield electrode 50. Shield electrode 50 is needed, in particular, to protect the resonator structures of the functional layer during anodic bonding. In response to application of a voltage, which is required for the subsequent anodic bonding, the resonator structures are pulled upwards by electrostatic forces and bonded to substrate 20. Shield electrode 50 is partially open, so that at the edge or at locations where no resonator structures of micromechanical structure 200 are provided, a connection is established between hollow space 10 and the region of porous silicon 11. This opening of the shield electrode is denoted in FIG. 3 by reference numeral 51. Thus, volume 10 to be evacuated, i.e., hollow space 10 is joined to the region of porous silicon 11.

Figure 4:
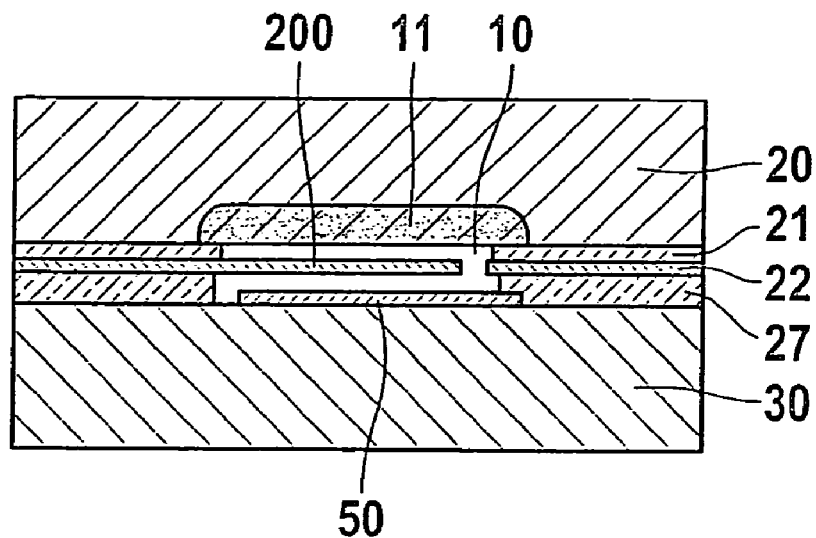
FIG. 4 is a third specific embodiment of the micromechanical component according to the present invention.

FIG. 4 shows a third specific embodiment of the micromechanical component according to the present invention. In the third specific embodiment, the region of porous silicon 11 in first substrate 20 is produced prior to application of sacrificial layer 21 or of functional layer 22. The sequence of layers illustrated in FIG. 4 is derived herefrom: initially first substrate 20, followed by the region of porous silicon 11, (etched-away) sacrificial layer 21, and, subsequently thereto, functional layer 22. The region of porous silicon 11, which is first produced in first substrate 20 in the third specific embodiment of the micromechanical component according to the present invention, is initially covered when micromechanical structure 200 is produced, by sacrificial oxide 21, i.e., sacrificial layer 21, and subsequently also by functional layer 22. By etching away sacrificial layer 21 to uncover micromechanical structure 200, the porous silicon, i.e., the region of porous silicon 11 is exposed again and, thus, activated.

Both in FIG. 3, as well as in FIG. 4, i.e., in the second specific embodiment and in the third specific embodiment of the component according to the present invention, it is provided very advantageously in accordance with the present invention for micromechanical structure 200 to represent an acceleration sensor or a rotation-rate sensor, this being provided, in particular, in the micropackage technology (MPT) illustrated in the figure.

Figure 5:
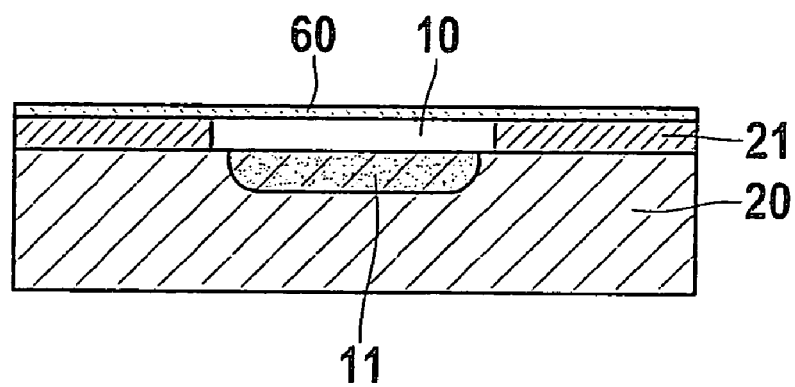
FIG. 5 is a fourth specific embodiment of the micromechanical component according to the present invention.

FIG. 5 shows a fourth specific embodiment of the micromechanical component according to the present invention. The fourth specific embodiment represents an absolute-pressure sensor having porous silicon as getter material for producing a low internal pressure in hollow space 10. The region of porous silicon is denoted, in turn, by reference numeral 11 and is situated in first substrate 20. In addition, in accordance with the fourth specific embodiment, the component according to the present invention includes a sacrificial layer 21 on first substrate 20, upon which a membrane 60 is provided. The top side of membrane 60, which is shown in the top part of FIG. 5, is subject to the ambient pressure of the pressure sensor, and an especially low internal pressure, produced by getter material 11, prevails in hollow space 10. A bending of membrane 60 as a function of the external pressure conditions is detected by sensor elements (not shown in FIG. 5) in the area of membrane 60, and is converted into electrical signals.

What is claimed is:

1. A micromechanical component for a sensor, comprising:
   a body having a first substrate and a second substrate that form a hollow space; and
   a region of porous silicon located contiguously thereto, wherein the region of porous silicon is provided for lowering a pressure prevailing in the hollow space, in that a gas is bound to the porous silicon.

2. The component as recited in claim 1, wherein the porous silicon binds oxygen by forming silicon dioxide in response to a low temperature.

3. The component as recited in claim 1,
   wherein an intermediate layer is provided between the first substrate and the second substrate, and wherein the porous silicon is in the second substrate.

4. The component as recited in claim 3, wherein the first substrate and the second substrate are joined to one another in such a way that they are hermetically sealed at the intermediate layer.

5. The component as recited in claim 1, further comprising:
   a membrane, wherein the hollow space is provided between the membrane and the first substrate, and the region of porous silicon is provided in the first substrate.

6. A method for manufacturing a sensor component, the method comprising:
   producing a micromechanical structure in a first substrate;
   producing in a second substrate a region of porous silicon;
   joining the first substrate and the second substrate; and
   lowering a pressure by activating the region of porous silicon.

7. A method for manufacturing a sensor component, the method comprising:
   producing a region of porous silicon in a first substrate;
   producing in the first substrate a micromechanical structure; and
   joining a second substrate to the first substrate; and
   lowering a pressure by activating the region of porous silicon.

8. A method for manufacturing a sensor component, the method comprising:
   producing a region of porous silicon in a first substrate;
   producing in the first substrate a micromechanical structure; and
   lowering a pressure by activating the region of porous silicon.

9. The micromechanical component of claim 1,
   wherein the micromechanical component is a pressure sensor.

10. The method of claim 6, wherein the micromechanical structure is a pressure sensor.

11. A micromechanical pressure sensor, comprising:
    a first substrate;
    a second substrate, wherein the first substrate is for bonding to the second substrate; and
    an intermediate layer provided between the first substrate and the second;
    a body having a hollow space and a region of porous silicon located contiguously thereto, wherein the region of porous silicon is arranged to lower a pressure prevailing in the hollow space by a gas being binded to the porous silicon.

12. The sensor as recited in claim 11, wherein the gas is oxygen, and the porous silicon binds the oxygen by forming silicon dioxide in response to a low temperature.

13. The sensor as recited in claim 11, wherein the first substrate and the second substrate are joined to one another so that they are hermetically sealed at the intermediate layer.

14. The sensor as recited in claim 11, wherein the hollow space is provided between the membrane and the first substrate, and the region of porous silicon is provided in the second substrate.

15. The sensor as recited in claim 11, wherein the hollow space is provided between the membrane and the first substrate, and the region of porous silicon is provided in the first substrate.

16. The sensor as recited in claim 11, wherein the porous silicon is used to provide a large surface area to provide effective getter characteristics.

17. The sensor as recited in claim 11, wherein the porous silicon is used to provide a large surface area of up to about 1000 $m^2$ per $cm^3$ to provide effective getter characteristics.

18. The sensor as recited in claim 11, wherein the porous silicon is used to eliminate the need for heating the component to high temperatures to activate getter characteristics of the porous silicon.

19. The component as recited in claim 1, wherein the porous silicon is used to provide a large surface area to provide effective getter characteristics.

20. The component as recited in claim 1, wherein the porous silicon is used to provide a large surface area of up to over 1000 $m^2$ per $cm^3$ to provide effective getter characteristics.

21. The component as recited in claim 1, wherein the porous silicon is used to eliminate the need for heating the component to high temperatures to activate getter characteristics of the porous silicon.

* * * * *